(12) United States Patent
Stuckey et al.

(10) Patent No.: US 8,896,335 B2
(45) Date of Patent: Nov. 25, 2014

(54) THERMAL CONTROLLER FOR ELECTRONIC DEVICES

(75) Inventors: Larry Stuckey, San-Diego, CA (US); Anastasios Golnas, Annapolis, MD (US); Robert Edward Aldaz, Saint Charles, IL (US); David Yu, Bloomingdale, IL (US)

(73) Assignee: Advantest Corporation, Tokyo (JP)

( * ) Notice: Subject to any disclaimer, the term of this patent is extended or adjusted under 35 U.S.C. 154(b) by 1180 days.

(21) Appl. No.: 12/278,841

(22) PCT Filed: Jul. 30, 2007

(86) PCT No.: PCT/US2007/074727
§ 371 (c)(1),
(2), (4) Date: May 24, 2010

(87) PCT Pub. No.: WO2009/017495
PCT Pub. Date: Feb. 5, 2009

(65) Prior Publication Data
US 2010/0224352 A1    Sep. 9, 2010

(51) Int. Cl.
*F25B 29/00* (2006.01)
*H01L 23/473* (2006.01)

(52) U.S. Cl.
CPC .................. *H01L 23/4735* (2013.01)
USPC ............. 324/750.08; 324/750.09; 324/750.1; 324/750.05; 324/750.06; 324/750.07; 165/206; 165/205; 165/50; 165/48.1; 165/101; 165/221; 165/104.33

(58) Field of Classification Search
USPC .......... 165/48.1, 50, 101, 205, 218–219, 221, 165/206, 104.33; 324/750.08, 750.09, 324/750.1, 750.05, 750.06, 750.07
See application file for complete search history.

(56) References Cited

U.S. PATENT DOCUMENTS

| | | | | |
|---|---|---|---|---|
| 3,241,602 A | * | 3/1966 | Andreassen | 165/221 |
| 3,259,175 A | * | 7/1966 | Kraus et al. | 165/267 |
| 3,721,386 A | * | 3/1973 | Brick et al. | 236/12.12 |
| 4,512,161 A | | 4/1985 | Logan et al. | |
| 5,023,695 A | | 6/1991 | Umezawa et al. | |
| 5,522,452 A | * | 6/1996 | Mizuno et al. | 165/286 |
| 5,802,856 A | * | 9/1998 | Schaper et al. | 165/206 |
| 5,918,469 A | * | 7/1999 | Cardella | 62/3.7 |
| 5,977,785 A | * | 11/1999 | Burward-Hoy | 324/750.09 |

(Continued)

FOREIGN PATENT DOCUMENTS

| | | |
|---|---|---|
| JP | 2004-511754 | 4/2004 |
| WO | 01/90766 | 11/2001 |

*Primary Examiner* — John Ford
(74) *Attorney, Agent, or Firm* — Greenblum & Bernstein, P.L.C.

(57) ABSTRACT

An apparatus controls a temperature of a device by circulating a fluid through a heat sink in thermal contact with the device. The apparatus includes an adjustable cold input, which inputs a cold portion of the fluid having a first temperature, and an adjustable hot input, which inputs a hot portion of the fluid having a second temperature higher than the first temperature. The apparatus further includes a chamber, connected to the cold input and hot input, in which the cold and hot portions of the fluid mix in a combined fluid portion that impinges on the heat sink. The combined fluid portion has a combined temperature that directly affects a temperature of the heat sink. The cold input and hot input are adjusted to dynamically control the combined temperature, enabling the heat sink temperature to compensate for changes in the device temperature, substantially maintaining a set point temperature of the device.

10 Claims, 10 Drawing Sheets

(56) References Cited

U.S. PATENT DOCUMENTS

| | | |
|---|---|---|
| 6,362,944 B1 * | 3/2002 | Tustaniwskyj et al. ....... 361/103 |
| 6,389,225 B1 * | 5/2002 | Malinoski et al. ............ 392/479 |
| 6,498,899 B2 * | 12/2002 | Malinoski et al. ............ 392/479 |
| 6,593,761 B1 * | 7/2003 | Fukasawa et al. ........ 324/750.13 |
| 6,668,570 B2 * | 12/2003 | Wall et al. ........................ 62/223 |
| 2003/0113106 A1 * | 6/2003 | Hwang et al. .................. 392/416 |
| 2006/0179861 A1 * | 8/2006 | Weber et al. ..................... 62/240 |
| 2008/0223555 A1 * | 9/2008 | Di Stefano .................... 165/101 |

\* cited by examiner

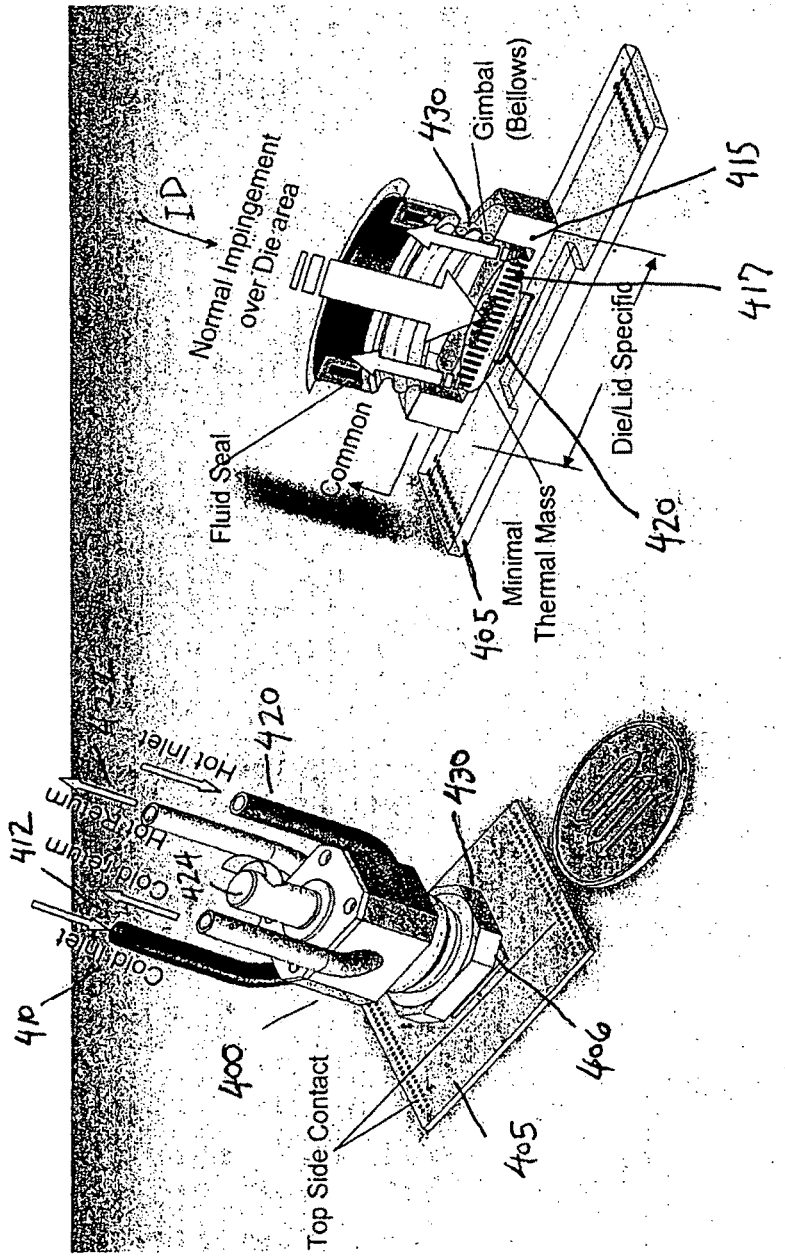

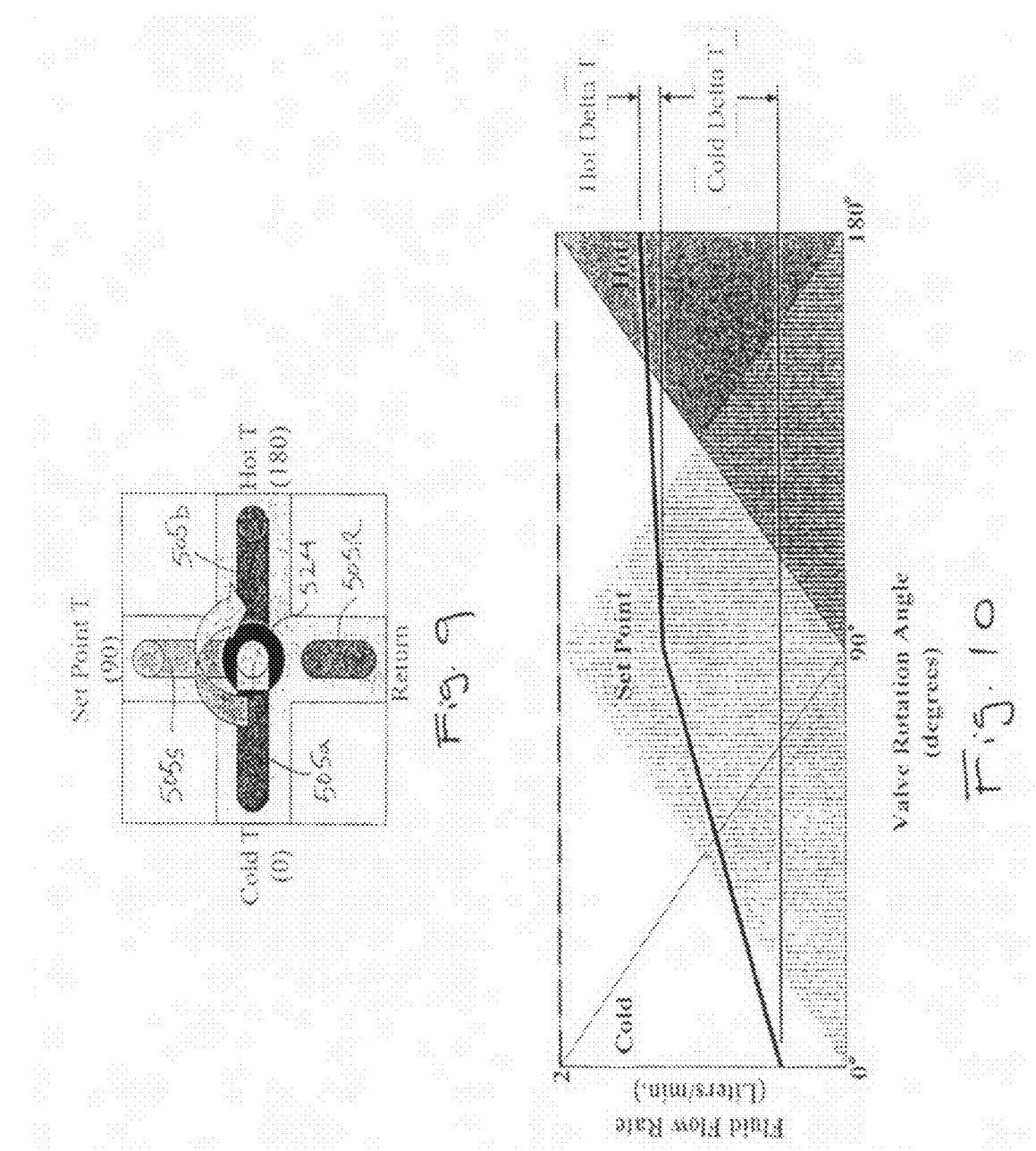

THERMAL CONTROLLER FOR ELECTRONIC DEVICES

BACKGROUND

1. Field of the Disclosure

The present disclosure relates to the field of temperature control, and more particularly, to maintaining a set point temperature through heating and/or cooling an electronic device or component, typically while the electronic device or component is under test.

2. Background Information

Solid state electronic devices or components, such as semiconductors, having varying performance characteristics based on temperature. Typically, for example, such electronic devices generate heat (i.e., self-heat) during operation, and thus as the internal temperature increases, the performance characteristics change. Also, solid state electronic devices may be used in different environments, possibly enduring a wide range of temperatures.

To ensure constant performance characteristics, it is desirable to maintain a relatively constant temperature of electronic devices. This is especially true when functionally testing electronic devices to ensure proper operation and compliance with design specifications. For example, an electronic device, referred to as a device under test (DUT), may undergo endurance procedures, such as short-circuit testing and burn-in testing, to observe various device characteristics. During such testing, the temperature of the DUT must be kept relatively constant at a predetermined test temperature, or set point temperature, in order for the results to be meaningful. In other words, the tester must be able to confirm that certain observed electrical characteristics are attributable to factors other than changing temperatures.

In order to maintain a constant temperature, known thermal control devices are cable of removing heat, e.g., through a heat sink, as well as adding heat, e.g., through an electric heater. A heat sink incorporates a fluid having a temperature much lower than the test temperature of the DUT. A heater is placed between the DUT and the heat sink, and power is applied to the heater to raise the temperature of the heater face, e.g., to the test temperature required for DUT testing. The heat sink offsets any excess heating, and also removes heat generated by the DUT during the testing process, to the extent this self-heating increases the device temperature beyond the test temperature. Power fluctuations may cause significant and relatively instantaneous self-heating, requiring the need for the thermal controller to quickly and accurately react to offset the unwanted increase in temperature.

However, the total amount of power that can be removed is limited by the heater itself, which has a maximum for power density (or Watt Density). For example, if a heater is capable of operating at 500 Watts, then approximately half of that power may be lost through the heat sink into the colder fluid simply to maintain the test temperature. Thus, for example, 250 Watts are required to maintain test temperature. Then, if power in the heater is reduced to zero in response to power being applied to the DUT, the maximum amount of power which can be removed from the DUT is 250 Watts. Otherwise, the heater will be unable to offset heat removed through the heat sink. This is particularly problematic in that current requirements of DUT testing have risen to 500 Watts total power and are projected to be higher in the future. Also, the heater also adds unwanted thermal resistance, adds thermal mass, induces gradients (non-thermally uniform surface) and renders an inadequate response time.

Improvements to this type of thermal controller are difficult to implement. For example, the heat sink must be appropriately balanced to the heater, which may be a disincentive for improving heat sink efficiency. That is, if the heat sink's heat removal capability is improved, e.g., by increasing fluid flow through the heat sink, reducing the fluid temperature, improving fin efficiency and/or incorporating a more effective fluid, the heater capacity would likewise need to be increased to offset the improvements in cooling capabilities and maintain the testing temperature.

Other thermal controllers are not necessarily dependent on the combination of heat sinks and heaters, but they still have functional inefficiencies. For example, Peltier devices create heat differentials from electric voltages, effectively acting as both a heat sink and a heat source. A drawback of Peltier devices, though, is that they are unable to remove significant power or to handle high power densities because the response time required to dynamically react to and remove power from an electronic device is inadequate. Therefore, the current thermal controllers do not adequately meet the demands of maintaining a constant temperature of an electronic device.

For example, FIG. 1 depicts a graph showing a typical thermal response of a conventional temperature control device, used to regulate the temperature of a DUT. The vertical axis indicates degrees in Celsius and the horizontal axis indicates passage of time, e.g., in seconds. The test temperature 102, also known as the set point temperature, represents the desired temperature at which testing is to be performed. FIG. 1 indicates set point temperature of 90 degrees Celsius. Also indicated is a fluid temperature 104, which is the temperature of fluid flowing through a heat sink, for example, which is configured to remove heat from the DUT. The fluid delta T is the difference in temperature between the test temperature 102 and the fluid temperature 104. The fluid temperature 104 depicted in the exemplary graph is approximately 30 degrees Celsius, which would result in the fluid delta T being 70 degrees Celsius. As is well known in the art, a greater fluid delta T enables a faster cooling capability of the heat sink.

As indicated, power is applied to both a heater and the DUT in the testing environment. The heater power 110 begins at a level (e.g., 500 Watts) that enables the heater to maintain a maximum temperature, indicated as 300 degrees Celsius in this example. Then, as device power 112 is incrementally added to the DUT to perform the desired testing, the heater power 110 is correspondingly decreased, reducing the heater temperature to compensate for the increase the device temperature 108. However, once the heater power 110 is reduced to zero, and the device temperature 108 continues to rise, the effects of the fluid temperature 104 of the heat sink is no longer sufficient to cool the DUT to maintain the test temperature 102, indicated by the depicted increase in the device temperature 108 after the heater power 110 is at zero. The testing system may thus become "broken" well before the device power 112 has reached the level required for appropriate testing.

As discussed above, increasing the fluid delta T of the heat sink is not particularly effective or efficient. This is because the heater power 110 (and thus the heater temperature) must be increased to compensate for the lower fluid temperature 104, particularly when the device power 112 is a lower levels. Much of this increase in heater power 110 is negated by the increased fluid delta T.

SUMMARY OF THE INVENTION

A non-limiting feature of the present invention provides an apparatus for controlling a temperature of a device by circulating a fluid through a heat sink in thermal contact with the device, the apparatus having an adjustable cold input configured to input a cold portion of the fluid having a first temperature, an adjustable hot input configured to input a hot portion of the fluid having a second temperature higher than the first temperature, and a chamber, connected to the cold input and the hot input, in which the cold portion and the hot portion of the fluid mix in a combined fluid portion that impinges on the heat sink, the combined fluid portion having a combined temperature that directly affects a temperature of the heat sink, wherein the cold input and the hot input are adjusted to dynamically control the combined temperature, such that the heat sink temperature compensates for changes in the device temperature and substantially maintains a set point temperature of the device. The device may also be a semiconductor.

The apparatus may further include an adjustable cold output configured to output an amount of the combined portion corresponding to the cold portion input by the adjustable cold input. Also, the apparatus may include an adjustable hot output configured to output an amount of the combined portion corresponding to the hot portion input by the adjustable hot input.

According to a second feature of the invention the first temperature may be within a range of approximately zero to approximately negative 140 degrees Celsius relative to the set point temperature and the second temperature may be within a range of approximately zero to approximately 75 degrees Celsius relative to the set point temperature. In other words, the first temperature may be within a range of equal to or 140 degrees Celsius lower than the set point temperature, and the second temperature may be within a range of approximately equal to or approximately 75 degrees Celsius greater than the set point temperature.

In another feature, the cold portion may be increased and the hot portion may be decreased as the temperature of the device increases. Also, cold portion is decreased and the hot portion may be increased as the temperature of the device decreases.

The apparatus may also include a chiller for substantially maintaining the first temperature of the cold portion and/or a heater for substantially maintaining the second temperature of the hot portion. Further, a first heat exchanger may be provided for substantially maintaining the first temperature of the cold portion; and a second heat exchanger may be provided for substantially maintaining the second temperature of the hot portion.

In a further non-limiting feature, a method is provided for controlling a temperature of a device in contact with a heat sink, using a first fluid having a first temperature and a second fluid having a second temperature, the method including determining a ratio of the first fluid and the second fluid to obtain a mixed fluid having a mixed temperature between the first temperature and the second temperature, mixing the first fluid and the second fluid in the determined ratio to obtain the mixed fluid, and distributing the mixed fluid within at least a portion of the heat sink to adjust a temperature of the heat sink to compensate for changes in the temperature of the device and to substantially maintain a target temperature of the device. The mixing of the first fluid and the second fluid may include inputting the first fluid through a first input port corresponding to the first fluid and the second fluid through a second input port corresponding to the second fluid, and outputting the combined fluid through a first output port corresponding to the first fluid and a second output port corresponding to the second fluid in accordance with the determined ratio. Also, the first temperature may be less than the target temperature and the second temperature may be greater than the target temperature. Additionally, the first temperature may be within a range of approximately zero to approximately negative 140 degrees Celsius relative to the set point temperature and the second temperature may be within a range of approximately zero to approximately 75 degrees Celsius relative to the set point temperature. In other words, the first temperature may be within a range of equal to or 140 degrees Celsius lower than the set point temperature, and the second temperature may be within a range of approximately equal to or approximately 75 degrees Celsius greater than the set point temperature.

According to another feature, the ratio of the first fluid to the second fluid may be determined to increase as the temperature of the device increases, and wherein the ratio of the first fluid to the second fluid may be determined to decrease as the temperature of the device decreases. Also, the first temperature may be maintained using a chiller, and the second temperature may be maintained using a heater.

In another feature of the present invention, an apparatus is provided for controlling a temperature of a device, the apparatus having a valve configured to mix a plurality of fluid portions, having a corresponding, plurality of fluid portion temperatures, to obtain a combined temperature, and a heat sink thermally coupled to the device, the heat sink having a heat sink temperature directly relating to the combined temperature, wherein proportional amounts of the plurality of fluid portions are adjusted to dynamically change the combined temperature and the correlating heat sink temperature, compensating for changes in the temperature of the device. The apparatus may further include thermal interface material positioned between the heat sink and the device, wherein the heat sink substantially maintains a target temperature of the device via the thermal interface material.

Additionally, the heat sink may include a plurality of fins, and a direction in which the combined fluid portion impinges on the heat sink may be generally perpendicular to a direction in which the fins extend.

In another non-limiting feature of the present invention, an apparatus is provided for controlling a temperature of a device by circulating a fluid through a heat sink in thermal contact with the device, the apparatus having an adjustable first fluid source configured to input a first fluid having a first temperature, an adjustable second fluid source configured to input a second fluid having a second temperature higher than the first temperature, an adjustable third fluid source configured to input a third fluid having a third temperature higher than the first and second temperatures, and a valve (which may be a disk valve) configured to discharge an adjustable amount of at least two of the first fluid, second fluid, and third fluid into a combined fluid that impinges on the heat sink, the combined fluid having a combined fluid temperature that directly affects the heat sink temperature, wherein the adjustable amount of at least two of the first fluid, second fluid, and third fluid are controllable such that the heat sink temperature compensates for changes in the device temperature and substantially maintains a set point temperature of the device.

Furthermore, the first fluid may be a cold fluid, the second fluid may be a set point fluid that may be generally the same temperature of the set point temperature of the device, and the third fluid may be a hot fluid. Also, the set point fluid temperature may be closer to the cold fluid temperature than it may be to the hot fluid temperature. Still further, at least two of the first fluid, second fluid, and third fluid may be portions of the same fluid, or the first fluid, second fluid, and third fluid may all be portions of the same fluid.

The apparatus may further include a first fluid return line, and a second fluid return line, wherein after the combined fluid impinges on the heat sink, a portion of the combined fluid may be returned to the first fluid source via the first fluid return line, and the remaining portion of the combined fluid may be returned to the second fluid source via the second fluid return line.

In yet another feature, the device may include a first electrical component testing device and a second electrical component testing device respectively having a first valve and a second valve and further respectively having a first heat sink and a second heat sink, wherein at least the second valve may be further configured to exclusively discharge the second fluid that impinges on the second heat sink, and wherein when the first electrical component testing device tests an electrical component, the first valve discharges the combined fluid that impinges on the first heat sink, the second electrical component testing device waits to test a next electrical component and the second valve exclusively discharges the second fluid that impinges on the second heat sink.

Still further, non-limiting feature of the invention provides a method for controlling a temperature of a device in contact with a heat sink, using a first fluid having a first temperature, a second fluid having a second temperature and a third fluid having a third temperature, the second temperature being higher than the first temperature and the third temperature being higher than the second temperature, the first, second and third fluids respectively stored in first, second and third fluid reservoirs, the method including determining a ratio of at least two of the first fluid, the second fluid and the third fluid to obtain a mixed fluid having a mixed temperature between the first temperature and the third temperature, discharging, from a respective reservoir, at least two of the first fluid, the second fluid and the third fluid in the determined ratio to obtain the mixed fluid, impinging the mixed fluid on at least a portion of the heat sink to adjust a temperature of the heat sink to compensate for changes in the temperature of the device and to substantially maintain a target temperature of the device. Also, the discharging at least two of the first fluid, the second fluid and the third fluid may include discharging at least two of the first fluid, the second fluid and the third fluid via a disk valve.

Also, the first fluid may be a cold fluid, the second fluid may be a target fluid that may be generally the same temperature of the target temperature of the device, and the third fluid may be a hot fluid. Still further, the set point fluid temperature may be closer to the cold fluid temperature than it is to the hot fluid temperature. Additionally, at least two of the first fluid, second fluid, and third fluid may be portions of the same fluid, or the first fluid, second fluid, and third fluid may all be portions of the same fluid.

The method may also include returning a portion of the combined fluid to the first fluid reservoir via a first fluid return line, after the impinging, and returning the remaining portion of the combined fluid to the second fluid reservoir via a second fluid return line, after the impinging.

Still yet, the device may include a first electrical component testing device and a second electrical component testing device having a respective first valve and second valve and a respective first heat sink and a second heat sink, and the discharging of the at least two of the first fluid, the second fluid and the third fluid occurs at the first electrical component testing device during testing of an electrical component, and the method may further include exclusively discharging the second fluid such that the second fluid impinges on the second heat sink, during the discharging of the at least two of the first fluid, the second fluid and the third fluid by the first electrical component testing device and while the second electrical component testing device waits to test a next electrical component. Also, the impinging may occur in a direction generally perpendicular to a direction in which fins of the heat sink extend.

BRIEF DESCRIPTION OF THE DRAWINGS

The present disclosure provides the detailed description that follows by reference to the noted drawings by way of non-limiting examples, in which like reference numerals represent similar parts throughout several views of the drawings, and in which:

FIG. 4 shows an exemplary schematic isometric view of a thermal chuck of a thermal controller, according to an aspect of the present invention;

FIG. 5 shows an exemplary enlarged schematic isometric sectional view of a thermal chuck of a thermal controller, according to an aspect of the present invention;

FIG. 9 shows an exemplary schematic view of a valve of a thermal controller, according to the further embodiment of the present invention;

FIG. 10 shows a graph of the mixing of cold, setpoint and hot fluids according to the further embodiment of the present invention;

DETAILED DESCRIPTION

The present disclosure relates to an apparatus and method for regulating the temperature of an electronic device, such as a solid state electronic device being tested in a controlled environment, referred to as a device under test (DUT). In an embodiment, the heater between the DUT and a heat sink of a conventional temperature control device may be eliminated. Instead, portions of a fluid (which may be any non-solid material, including but not limited to a liquid, a gas, particulates, granules or any combination thereof), having different respective temperatures are mixed in varying proportions within a heat sink to maintain and control the temperature of the DUT. Alternatively, at least two different fluids, having different respective temperatures, may be mixed in varying proportions within the heat sink to maintain and control the temperature of the DUT. Additionally, two or more different fluids in different states of matter may be used in the present invention. For example, a gaseous fluid may be mixed with a liquid fluid, in accordance with a non-limiting feature of the present invention. Accordingly, the total heat sink of the present disclosure has less thermal mass and less thermal resistance.

In an embodiment, valve(s) control the proportion and duty cycle of the fluid(s) entering the heat sink. There is no limit to the heat sink design. That is, the efficiency and heat removal capability can be increased to maximum potential by increasing the fluid flow rates, increasing pressure, optimizing fin efficiency, selecting an improved fluid, increasing flow rate, increasing the delta T (i.e. the temperature of the heat sink fluid relative to that of a DUT testing temperature), and the like. Significantly, the principle of a cold delta T of the fluid will be applied to the heating need as well (i.e., a hot delta T). That is, instead of requiring a heater to raise the temperature of the heat sink, as needed, a hot fluid with a large delta T will be used. In addition, due to elimination of the heater and associated heater traces, thermal gradients on the heat sink surface will be virtually eliminated.

Figure 1:
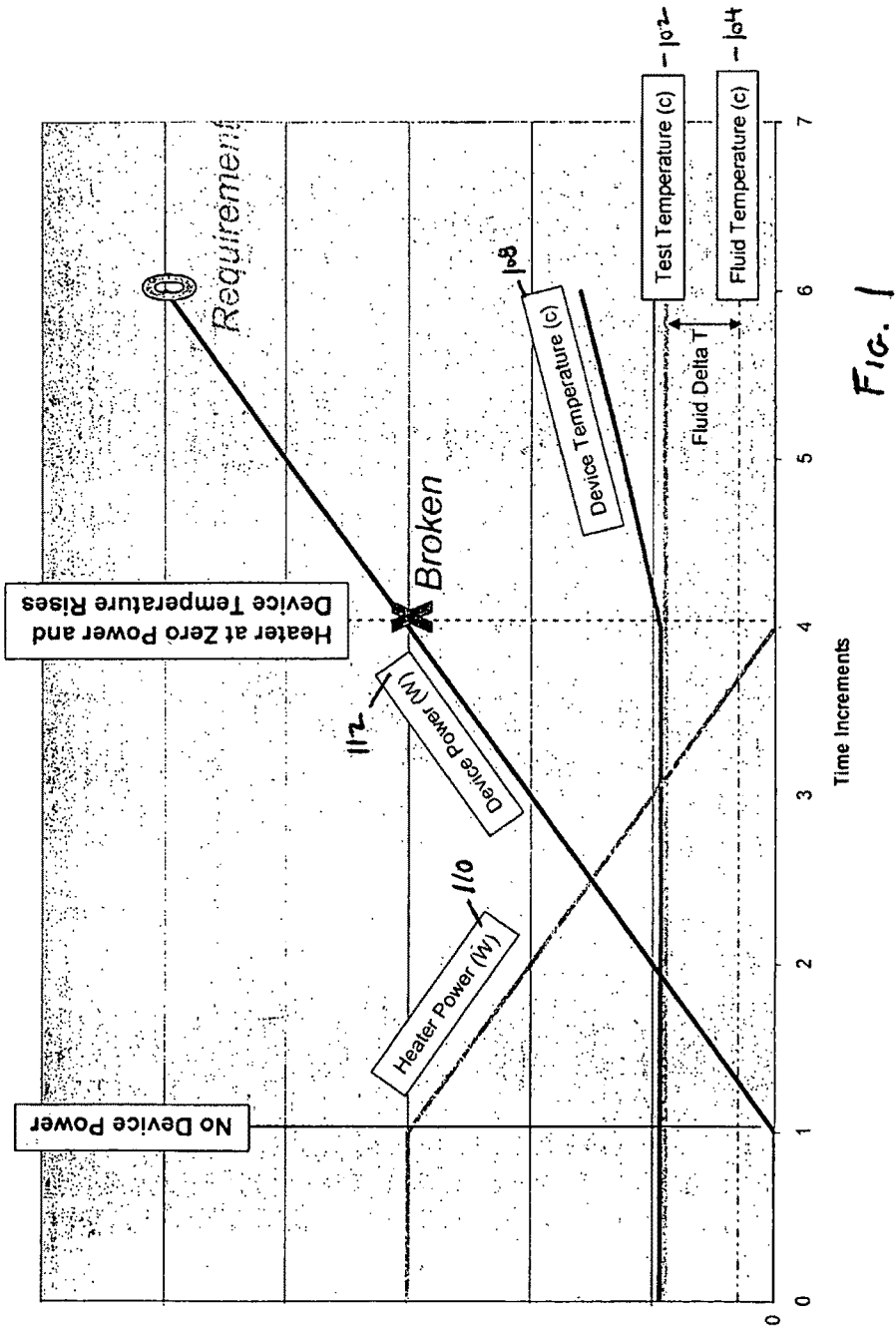
FIG. 1 shows an exemplary thermal response of a thermal controller typical in the prior art.
Figure 2:
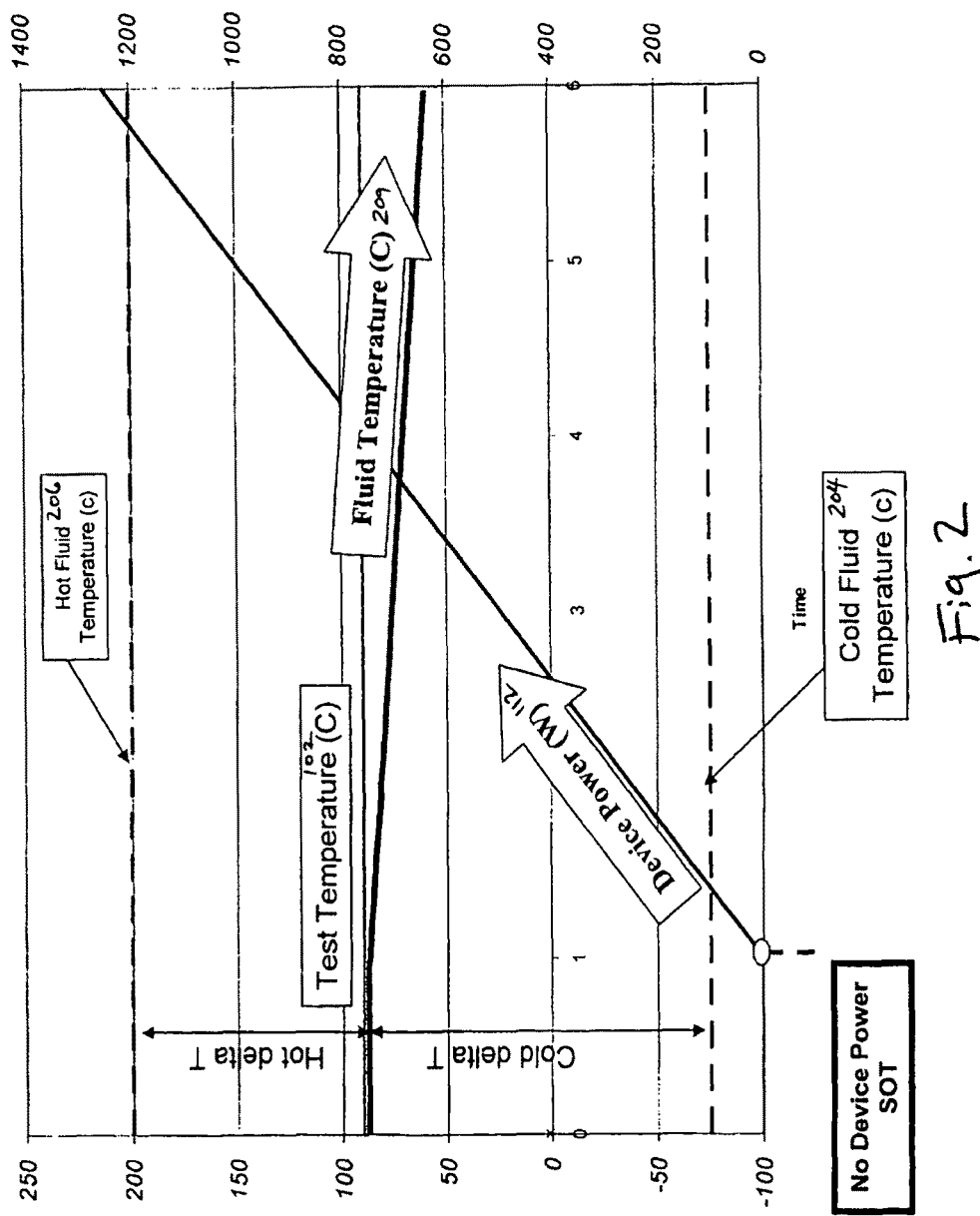
FIG. 2 shows a graph of an exemplary thermal response of a thermal controller, according to an aspect of the present invention.

FIG. 2 depicts a graph showing a typical thermal response of a temperature control device, used to regulate the temperature of a DUT, according to an aspect of the present invention. There is no device power until SOT (start of test). Again, the test temperature 102 is set for an exemplary 90 degrees Celsius. Also, there is a cold fluid temperature 204, as well as a hot fluid temperature 206, which respectively provide a cold fluid delta T and a hot fluid delta T relative to the test temperature 102. There is no heater power indicated since there is no heater employed to offset the effects of the cold fluid in the heat sink.

Because there are no concerns about negating heater power, the cold fluid temperature 204 may be significantly less than the cold fluid temperature 104 of the conventional system. FIG. 2 depicts an exemplary embodiment in which the cold fluid temperature 204 is indicated to be approximately negative 30 degrees Celsius, resulting in an approximately 120 degrees Celsius cold fluid delta T. The exemplary embodiment of FIG. 2 also indicates the hot fluid temperature 206 to be approximately 200 degrees Celsius, resulting in an approximately 110 degrees Celsius hot fluid delta T.

The cold fluid and the hot fluid, or cold and hot portions of the same fluid (i.e., commonly-circulated fluid), are mixed in continually adjustable proportions (as discussed below), resulting in a combined heat sink fluid temperature 209. In all embodiments, those skilled in the are would appreciate that the fluid(s) used may be the same, commonly-circulated fluid (e.g., in which different portions of the same fluid are heated and/or cooled), or alternatively, may be two or more discrete fluids in separate reservoirs and do not communicate with each other until they are mixed. In order to maintain the test temperature 102, the combined heat sink fluid temperature 209 is adjusted to offset the increasing device power 112 (and corresponding increasing device temperature), as indicated by the drop in heat sink fluid temperature 209 corresponding to the rise in the device power 112. In this manner, the device power 112 may be increased to the maximum test requirement while maintaining the test temperature 102.

Figure 3:
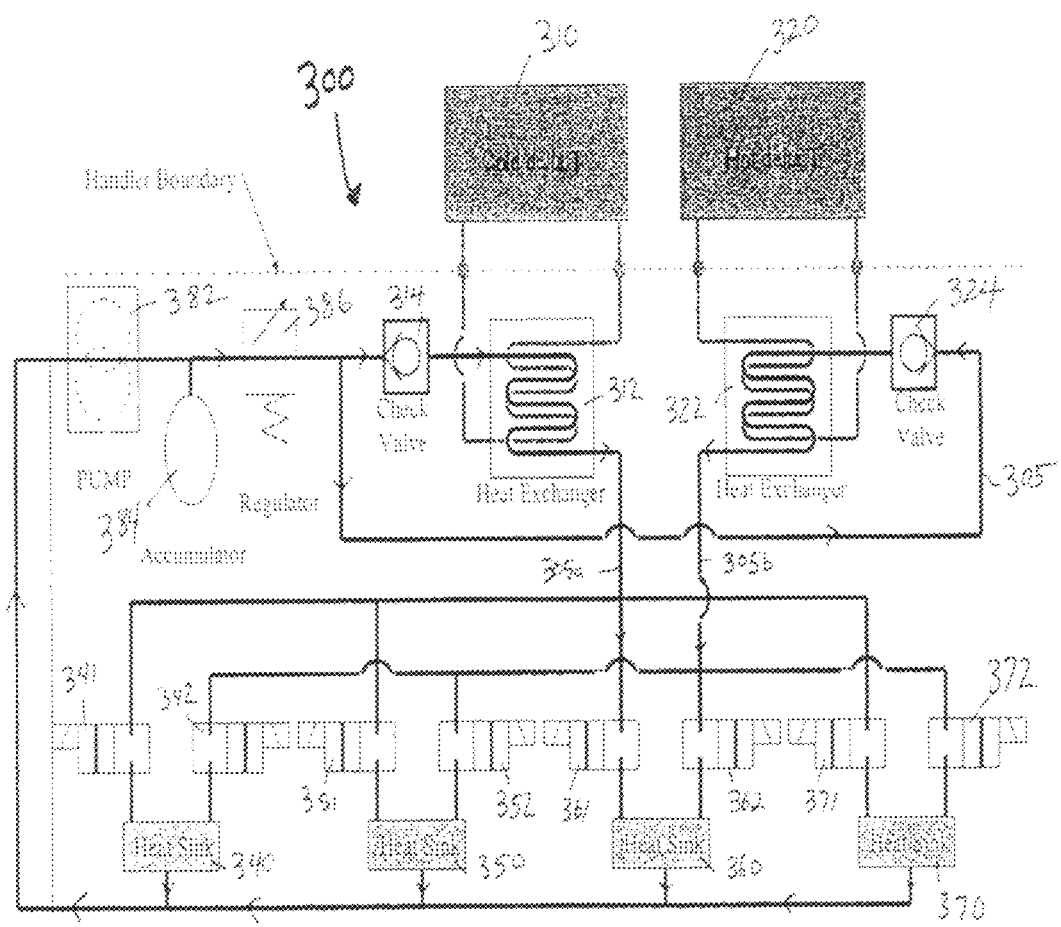
FIG. 3 shows an exemplary block diagram of a thermal controller, according to an aspect of the present invention.

FIG. 3 shows a schematic block diagram of an exemplary thermal controller, according to an embodiment of the invention, capable of the temperature control performance depicted in FIG. 2. In the depicted embodiment, a thermal controller 300 includes a closed system that circulates a fluid, for example. Dynalene HC-10, through a series of heat exchangers and valves, such that a portion of the fluid is cooled to the cold delta T, through thermal interaction with a cold delta T reservoir 310, while another portion of the fluid is heated to the hot delta T, through thermal interaction with a hot delta T reservoir 320. For example, in the depicted embodiment, the cold reservoir 310 and the hot reservoir 320 are incorporated into separate closed systems, which respectively pass cold and hot fluid through the heat exchangers 312 and 322, which may be, for example, parallel-flow heat exchangers. Of course, it is understood that any type of heat exchangers may be incorporated into the thermal controller 300 without departing from the scope and spirit of the present invention. It is further understood that reference to the use of fluid in the thermal controller 300 is non-limiting, and is intended to apply to a liquid, a gas, or a liquid/gas combination.

The cold delta T reservoir 310 may incorporate a chiller, for example, which maintains a temperature cold enough for the output of the heat exchanger 312 to be the cold delta T (e.g., a cold output temperature of negative 30 degrees Celsius, which provides a 120 degrees Celsius cold delta T, as indicated in FIG. 2). The chiller may be single stage or cascading, depending on the cooling requirements, which may vary, for example, based the type of test and/or the customer's needs. The hot delta T reservoir 310 may be a boiler, for example, which maintains a temperature hot enough for the output of the heat exchanger 322 to be the hot delta T (e.g., a hot output temperature of 200 degrees Celsius, which provides a 110 degrees Celsius hot delta T, as indicated in FIG. 2). Again, any means of generating and maintaining the appropriate cold delta T and hot delta T of the fluid used in the thermal controller 300, including cooling and heating systems that do not rely on heat exchangers, may be incorporated herein without departing from the scope and spirit of the present invention.

The heat exchangers 312 and 322 adjust the temperature of a fluid running through a single conduit 305, which directs the fluid through heat sinks 340, 350, 360 and 370, via various branches. Each of the heat sinks contacts an associated electronic device (e.g., a DUT), for which a set point temperature is to be maintained. In the depicted embodiment, the conduit 305 is a separate closed system, which transfers the fluid exiting the heat sinks back to both of the heat exchangers 312 and 322, for example, in amounts proportional to the amount of fluid that had exited the heat exchangers 312 and 322.

The fluid may be moved through the conduit 305 by any suitable means and any suitable pressure. For example, in the depicted embodiment, a pump 382 (which in an embodiment may pump fluid at approximately 180 PSI, but those skilled in the art would readily appreciate that fluid may be pumped at a greater or lower rate, depending on the needs of the system) pumps the fluid through the conduit 305, while an accumulator 384 (which in an embodiment may pump fluid at approximately 180 PSI, but those skilled in the art would readily appreciate that fluid may be pumped at a greater or lower rate, depending on the needs of the system) and a regulator 386 (which in an embodiment may pump fluid at approximately 160 PSI, but those skilled in the art would readily appreciate that fluid may be pumped at a greater or lower rate, depending on the needs of the system) maintain a constant pressure within the system. The fluid enters the heat exchangers 312 and 322 through valves, such as two-port check valves 314 and 324, respectively, assuring proper directional flow through the heat exchangers 312 and 322, and regulating the amount of the fluid entering each of the heat exchangers 312 and 322.

The portion of the fluid that passes through the heat exchanger 312 is cooled to a predetermined cold temperature (e.g., negative 30 degrees Celsius), consistent with the cold delta T (e.g., 120 degrees Celsius), as depicted, for example, by the graph in FIG. 2. Likewise, the portion of the fluid that passes through the heat exchanger 322 is heated to a predetermined hot temperature (e.g., 200 degrees Celsius), consistent with the hot delta T (e.g., 110 degrees Celsius), also depicted in FIG. 2. The cold fluid portion and the hot fluid portion respectively exit the heat exchangers 312 and 322 via branches 305a and 305b of the conduit 305.

In the depicted embodiment, the cold fluid portion of the fluid in the branch 305a is divided to flow through four cold control valves 341, 351, 361 and 371 corresponding to the four heat sinks 340, 350, 360 and 370. The hot fluid portion in the branch 305b is likewise divided to flow through four hot control valves 342, 352, 362 and 372 corresponding to the four heat sinks 340, 350, 360 and 370. The control valves may be, for example, pulse width modulated (PWM) analog flow control valves, microelectro-mechanical systems (MEMS) flow control valves, or the like. Of course, the system may include any number or types of control valves, as well as corresponding heat sinks, without departing from the scope and spirit of the present invention. For example, in a simplified embodiment, the thermal controller 300 would include one cold fluid control valve corresponding to the heat exchanger 312, one hot fluid control valve corresponding to the heat exchanger 322, and a single heat sink.

The cold control valves 341, 351, 361 and 371 are paired with the hot control valves 342, 352, 362 and 372, so that each heat sink has two inlets, one for the cold fluid portion and one for the hot fluid portion, respectively controlled by a cold control valve and a hot control valve. In this manner, the control valves may be operated to adjust the respective amounts of the cold fluid portion and the hot fluid portion to obtain a mixed fluid portion within the heat sink having a desired temperature. For example, the cold fluid portion and the hot fluid portion may mix in a chamber of the heat sink.

Figure 7:
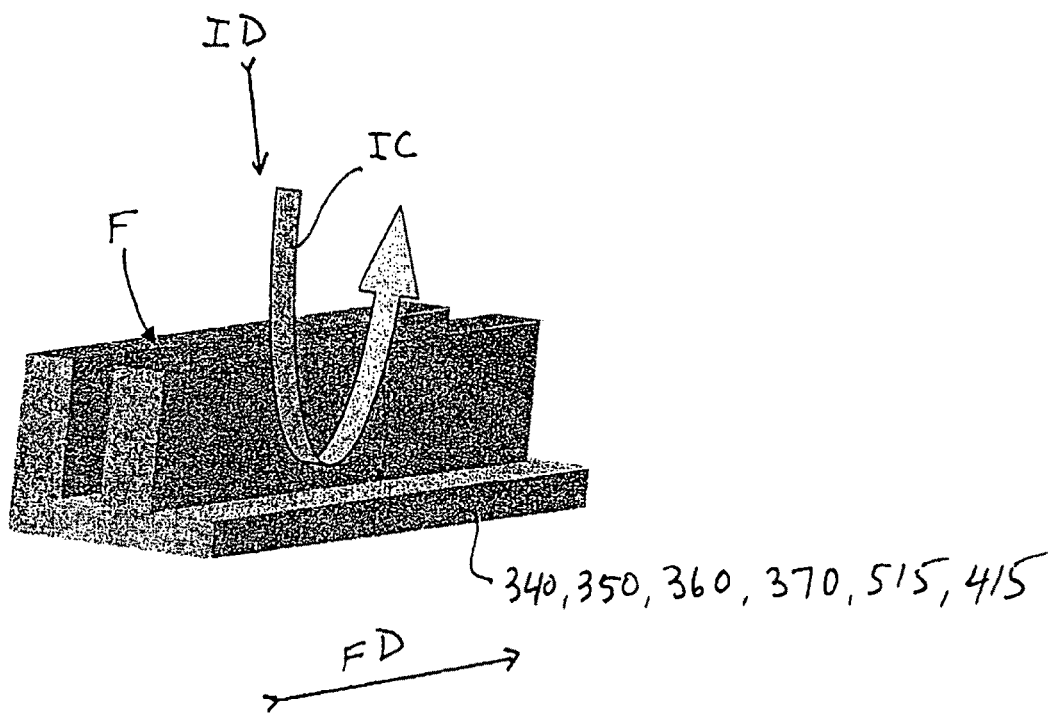
FIG. 7 shows an exemplary schematic view of a heat sink, according to an aspect of the present invention.

The mixed fluid portion impinges on each of the heat sinks 340, 350, 360 and 370, thus controlling the temperature of each of the heat sinks (and thus the temperature of the respective DUTs). As defined herein, an impinging direction is a direction extending generally perpendicular (i.e., normal, shown as arrow ID) to the direction of extension of fins F (shown as arrow FD) of each heat sink 340, 350, 360 and 370, as schematically shown in FIG. 7. The mixed fluid portion impinging and circulating within the fins of the heat sink 340, 350, 360 and 370 is generally shown as arrow IC. By the mixed fluid portion impinging on the heat sinks, the effects of the combined temperature are directly and efficiently transferred to the heat sinks. Also, the mixed fluid portion is evenly distributed throughout each of the heat sinks, avoiding induced thermal gradients and other undesirable effects of uneven temperature distribution. The cold and hot fluid control valves may be located in close proximity to the respective heat sinks in order to increase the time response of the heat sinks with respect to changes in temperature of the impinging fluid, i.e., approaching an instantaneous time response.

Referring to one set of control vales and heat sink for purposes of explanation, the control valves 361 and 362 open or close in response to signals received from sensor(s) (not shown), such as thermostats, that monitor changes in the temperature of the heat sink 360 and/or the DUT attached to or otherwise serviced by the heat sink 360. The adjustable amounts of the cold fluid portion and the hot fluid portion from the pair of control valves 361 and 362 mix together in a desired ratio and impinge on the heat sink 360, as described above. Adjusting the flow rates of the control valves 361 and 362 may be controlled locally at the valves or collectively by a central control processing system, which may receive flow rate and position data from the valves and temperature data from the heat sinks and/or DUTs, without departing from the spirit or scope of the present invention.

In an embodiment, the heat sink 360 is attached to a thermal interface material, such as thermal interface material 420 (FIG. 5), which contacts the DUT, enabling more efficient and uniform temperature distribution over the DUT. The thermal interface material may include carbon nanotubes on a metallic substrate structure, for example.

The temperature of the mixed fluid portion is adjustable as a function of the amount of each fluid allowed to enter the heat sink 360 through each of the adjustable control valves 361 and 362, as needed to maintain the set point temperature of the DUT. For example, as the temperature of the DUT interfacing with the heat sink 360 begins to rise, e.g., in response to increased power to the DUT, the temperature of the heat sink 360 must be lowered to counteract this change. Accordingly, the cold fluid control valve 361 is opened incrementally and/or the hot fluid control valve 361 is closed incrementally, based on signals received from the sensor(s) of the heat sink 360 indicating the rise in temperature. Conversely, as the temperature of the DUT attached to the heat sink 360 begins to fall, the temperature of the heat sink 360 must be increased, so the cold fluid control valve 361 is closed incrementally and/or the hot fluid control valve 361 is opened incrementally. Each of the heat sinks 340, 350, 360 and 370 may have dedicated sensors to offset variables that may effect the DUTs. For example, the DUTs may have slightly different thermal properties or the timing of the various tests may differ.

The mixed fluid portion exits each of the heat sinks 340, 350, 360 and 370, and is returned through the conduit 305 to the heat exchangers 312 and 322. The process of separately cooling and heating portions of the fluid, and adjusting the ratio of the mixed cold fluid portion and hot fluid portion continues based on the monitoring of each DUT and/or heat sink temperature.

In an embodiment, the mixed fluid may exit each of the heat sinks 340, 350, 360 and 370 through separate cold and hot outlets and/or valves, which correspond to the cold and hot inlets. Like the cold and hot inlets, the cold and hot outlets are adjustable, for example, so that a proportion of the mixed fluid portion exiting each of the cold and hot outlets corresponds to the proportion of the cold or hot fluid portion entering the inlets. Alternatively, or in addition to controlling the proportion of the mixed fluid portion exiting each of the heat sinks 340, 350, 360 and 370, the amount of mixed fluid entering each of heat exchangers 312 and 322 may likewise be controlled by the check valves 314 and 324, respectively, so that the amount of the mixed fluid returning to each of the heat exchangers 312 and 322 is proportionate to the corresponding amounts of the cold and hot fluid portions entering the heat sinks 340, 350, 360 and 370. In this manner, the heat exchangers 312 and 322 are generally required to cool or heat, respectively, a proportionate amount of the total fluid, as dictated by the generally current demands for maintaining the DUT temperatures, thus increasing the efficiency of the system.

Further, the mixed fluid portion exiting the separate cold and hot outlets may be separately returned to the respective heat exchangers 312 and 322 through separate conduits. For example, when the mixed fluid portion impinging on the heat sink 360 is 65 percent cold fluid and 35 percent hot fluid, then 65 percent of the mixed fluid exits the heat sink assembly through the cold return conduit and 35 percent of the mixed fluid exits through the hot return conduit. Again, the heat exchanger 312 and the heat exchanger 322 are thus called upon to cool or heat, respectively, a proportionate amount of the total fluid, thus increasing the efficiency of the system.

In another embodiment, the cold fluid portion and the hot fluid portion are not literally mixed at the heat sink, but rather transfer thermal energy to the heat sink while remaining in separate conduits. For example, the hot fluid portion circulated from the hot delta T reservoir 320 passes through the heat sink (e.g., heat sink 360), transferring heat to the heat sink, e.g., through a heat sink heat exchanger (not pictured), and returns the heat exchanger 322 (corresponding to the hot delta T reservoir 320). Accordingly, the heat exchanger 322, the input hot control valves 342, 352, 362 and 372 and the corresponding output hot control valves and hot return conduits (not pictured) may function as separate closed systems. Likewise, the heat exchanger 312 (corresponding to the cold delta T reservoir 310), the input cold control valves 341, 351, 361 and 371, and the corresponding output cold control vales and return conduits (not pictured) may function as a closed system. Also, this embodiment enables the use of separate fluids and/or different fluid types to supply the cold delta T and the hot delta T.

Further, when the cooling cycle and the heating cycle of the thermal control device are kept separate by separate return conduits and not by mixing the hot and cold fluid portions, the heat exchangers 312 and 322 may be eliminated. Thus, the cold fluid in the cold delta T reservoir 310, cooled by a chiller, for example, may be directly ported in a controlled amount to the heat sinks 340, 350, 360 and 370, and a proportionate amount of fluid will be returned to the cold delta T reservoir 310 via the cold return conduit. Likewise, the hot fluid in the hot delta T reservoir 320, heated by a boiler, for example, may be directly ported to the heat sinks 340, 350, 360 and 370, with a proportionate amount of fluid being replenished via the hot return conduit. In this way, the cold delta T reservoir 310 and the hot delta T reservoir 320 are replenished in accordance with the amount of fluid directly drawn from the respective reservoirs.

Further, in an alternative embodiment, the ratio of cold and hot fluids may be controlled by a one or more single thermal chucks which generally simultaneously adjusts the amounts of cold and hot fluids mixing and impinging on a heat sink. For example, as shown in FIGS. 4 and 5, a thermal chuck 400 for a single heat sink 415 adjusts the amount of fluid entering the thermal chuck through a cold inlet 410 and a separate hot inlet 420, by actuation of a valve 424 (including but not limited to a disk valve). The thermal chuck 400 also includes a cold return 412 and hot return 422 corresponding to the cold inlet 410 and the hot inlet 420, respectively. The fluid portions that mix and impinge on the heat sink 415 may thus exit the thermal chuck 400 through the cold return 412 and the hot return 422 in the same ratio of cold to hot as the fluid entering through the cold inlet 410 and the hot inlet 420, as discussed above. Further, the present invention may use a plurality of interconnected thermal chucks 400, similar to the arrangement shown in FIG. 3.

The thermal chuck 400 contacts, and may be attachable to, a die (e.g., the DUT 406) on a substrate 405 via a gimbal 430, which provides flexibility in positioning. As shown particularly in FIG. 5, the incoming mixed fluid impinges on the heat sink 415 by mixing in a chamber 417, and may circulate within the heat sink 415 through internal channels of the chamber 417. The heat sink 415 interacts with the surface of the DUT 406, for example, through the thermal interface material 420, enabling efficient and uniform thermal exchange, as discussed above. In an embodiment, the fluid enters the thermal chuck 400 in adjustable portions through the cold inlet 410 and the hot inlet 420 and continuously impinges on the heat sink 415. The fluid exits the thermal chuck 400 through the cold return 412 and the hot return 422, as discussed above.

Of course, it is understood that any method of transferring thermal energy from fluids having different temperatures (i.e., for maintaining a cold delta T and a hot delta T) in order to control the temperature of a heat sink may be incorporated herein without affecting the scope and spirit of the present invention. It is further understood that the fluids may have any number of different temperatures. For example, in an embodiment of the invention, the fluid flowing through the conduit 305 may be divided into three or more portions, each having a different delta T, which may be mixed in various proportions to achieve a desired mixed fluid portion temperature.

Figure 6:
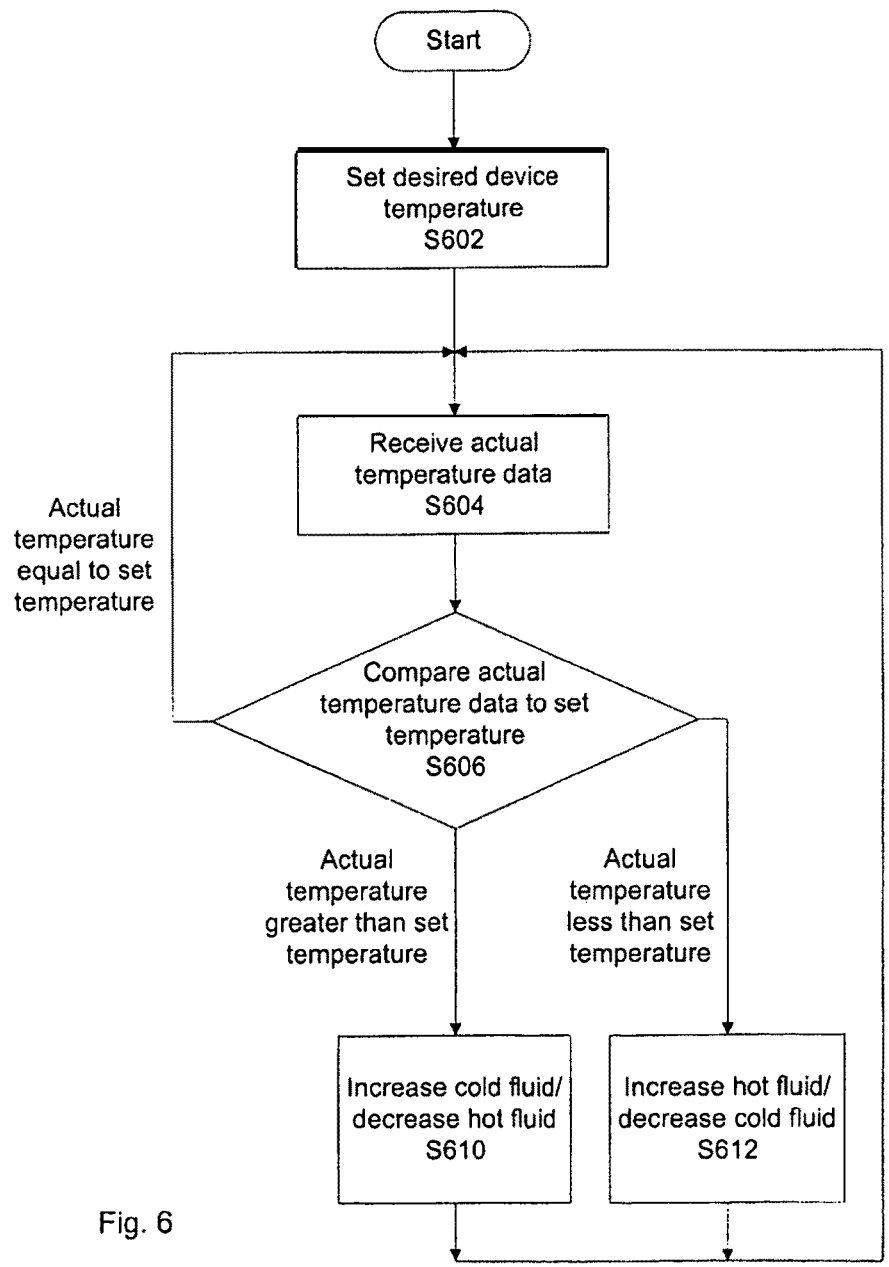
FIG. 6 shows a flowchart of an exemplary method for controlling the temperature of an electronic device, according to an aspect of the present invention.

FIG. 6 shows a flow chart of an exemplary method for controlling the temperature of an electronic device, according to an aspect of the present invention. In step S602, a desired or target temperature is set for the thermal controller to maintain. The target temperature may be a set point temperature at which a DUT is to be tested (e.g., 90 degrees Celsius). Alternatively, the target temperature may be a desirable temperature (or temperature range) at which an electronic component is to function in an operational environment.

At step S604 the actual temperature of the electronic device (e.g., the DUT) and/or of the heat sink in contact with the electronic device is measured. The measured temperature is then compared to the desired temperature. When the two temperatures are the same, no adjustment is made to the fluid mixture of the heat sink, and the process returns to step S604 to receive updated temperature data.

When the actual temperature is less than the set temperature, the amount of hot fluid flowing through the heat sink is increased and/or the amount of cold fluid flowing through the heat sink is decreased at step S612, thus increasing the heat sink temperature. When the actual temperature is greater than the set temperature, the amount of cold fluid flowing through the heat sink is increased and/or the amount of hot fluid flowing through the heat sink is decreased at step S610, thus reducing the heat sink temperature. In either case, after the flow adjustments are made, the process returns to step S604 to receive updated temperature data, and the subsequent steps are repeated as necessary.

Figure 8:
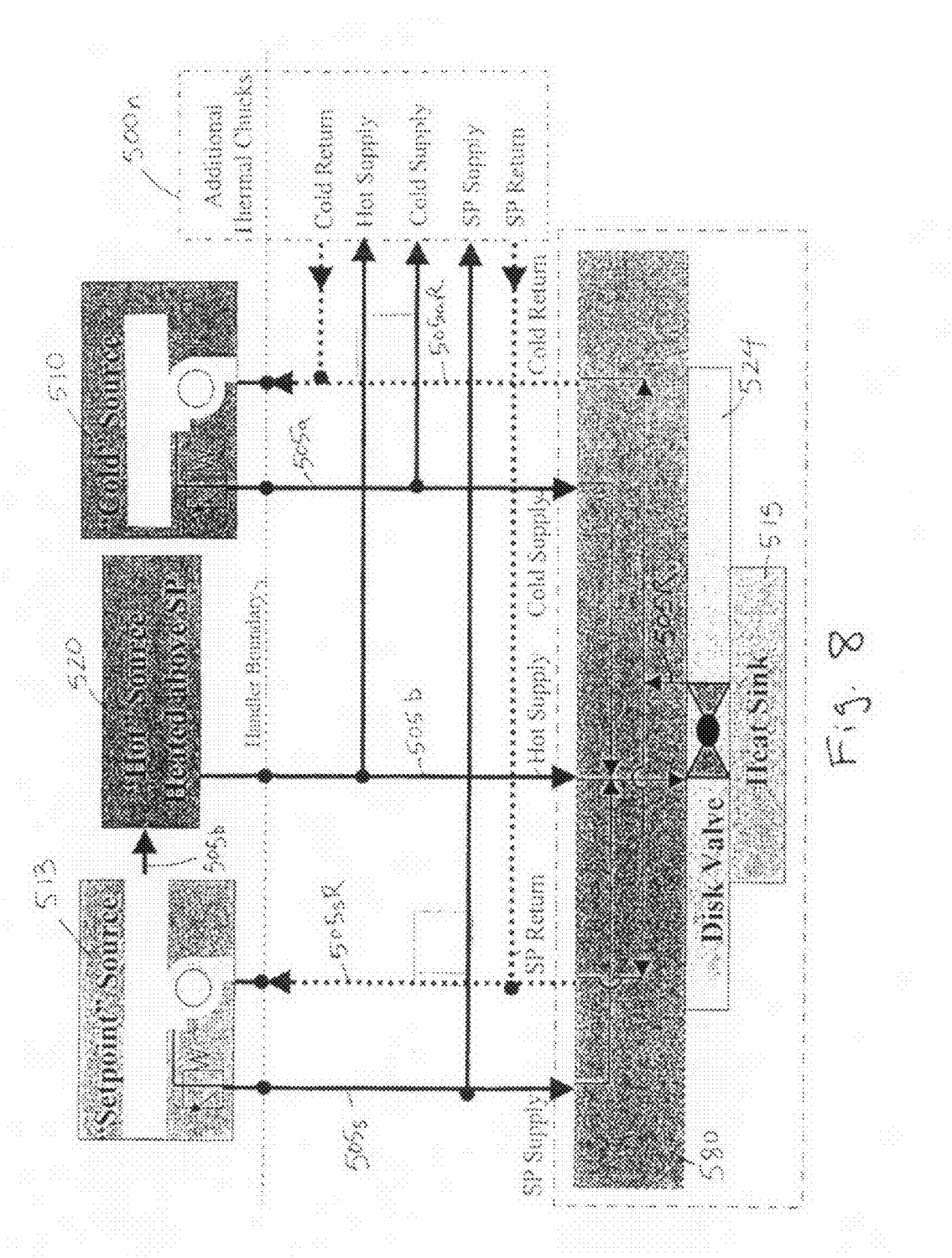
FIG. 8 shows an exemplary schematic view of a thermal chuck of a thermal controller, according to a further embodiment of the present invention.

FIG. 8 shows a schematic view of a thermal chuck 500 in accordance with a further embodiment of the present invention. This embodiment utilizes three fluid sources (also referred to as reservoirs), namely a cold fluid source 510, a setpoint fluid source 513 and a hot fluid source 520. The fluid in the setpoint fluid source 513 is set at a temperature higher than the fluid in the cold fluid source 510. More specifically, the fluid in the setpoint fluid source 513 is set at a temperature that is generally the same as a setpoint temperature of a DUT (taking into consideration the thermal loss potentially occurring though the thermal chuck 500). For example, if the setpoint of the DUT is 80 degrees Celsius, the temperature of the fluid in the setpoint fluid source 513 may be set at, e.g., 85 degrees Celsius. Further, the temperature of the fluid in the hot fluid source is set at a temperature higher than the fluid in the setpoint fluid source 513. For increased energy efficiency, the set point fluid temperature may be closer to the cold fluid temperature than it is to the hot fluid temperature. While FIG. 8 shows three fluid sources of three different temperatures 510, 513, 520, it is appreciated by those of skill in the art that more than three fluid sources of more than three different temperatures may be used in alternative embodiments. For example, should the system be configured to test three DUTs at three different setpoint temperatures, the system may include a cold fluid source, a first setpoint fluid source, a second setpoint fluid source, a third setpoint fluid source and a hot fluid source, totaling five different fluid sources containing respective fluids of five different temperatures.

As shown in FIG. 8, a conduit 505 interconnects the three fluid sources 510, 513, 520 to heat sink 515. Specifically, cold fluid passes though cold fluid conduit 505a and is directed through the thermal chuck 500 via manifold 580, where the cold fluid communicates with a valve 524 (including but not limited to a disk valve). Further, setpoint fluid exits the setpoint source 513 to enter the hot fluid source 520 via conduit 505b. Once the setpoint fluid in the hot source 520 has reached a predetermined hot temperature, the hot fluid passes through conduit 505b and is directed through the thermal chuck 500 via manifold 580, where the hot fluid communicates with valve 524. Setpoint fluid not directed to the hot fluid source 520 passes through conduit 505s is directed through the thermal chuck 500 via manifold 580, where the setpoint fluid communicates with valve 524. During testing of the DUT, setpoint fluid may exclusively mix with cold fluid, for increased energy efficiency. In other words, eliminating the direct mixing of cold and hot fluid results in increased energy efficiency, since directly mixing cold and hot fluid results in significant energy consumption as well as increased chance of thermal gradients across the heat sink 515.

FIG. 9 schematically shows a disk valve 524 in communication with cold fluid conduit 505a, setpoint fluid conduit 505s and hot fluid conduit 505b. The valve 524 is preferably mounted immediately above the heat sink, and rotates either 180 or 360 degrees to discharge a desired mixture of cold fluid, setpoint fluid and hot fluid, such that combined fluid of a predetermined temperature may impinge upon the heat sink 515 (shown in FIG. 8). Specifically, in a non-limiting embodiment, when the valve 524 is at zero degrees of rotation, cold fluid is discharged; when the valve is at 90 degrees of rotation, setpoint fluid is discharged; when the valve is at 180 degrees of rotation, hot fluid is discharged; and when the valve is at 270 degrees of rotation, fluid that has already impinged upon the heat sink 515 is returned via return conduit 505R (shown in FIG. 8), thereby enabling fluid to be discharged at a generally constant rate. In this way, the valve 524 is preferably located at the junction of the fluid supply conduits 505a, 505s and 505b. For optimal fast temperature response, it is preferable for the mixing of fluids to be at the inlet of the heat sink, to minimize fluid transit time. Also, with the above-described configuration, the heat sink 515 and mixing chamber 517 (shown in FIG. 11) only require a single inlet and a single outlet. Further, problems with incompressibility of the fluid are reduced due to the close proximity of the fluid mixing to the heat sink 515. Additionally, the above-described configuration reduces problems with repeatability and hysteresis.

FIG. 10 is a graph showing the mixing of cold, setpoint and hot fluids in relation to the actuation of the valve 524. Specifically, FIG. 10 shows the combined flow of to be at a constant rate of approximately two liters per minute; however, those of skill in the art would appreciate that this rate can be greater than or less than two liters per minute and can be varied instead of constant.

Figure 11:
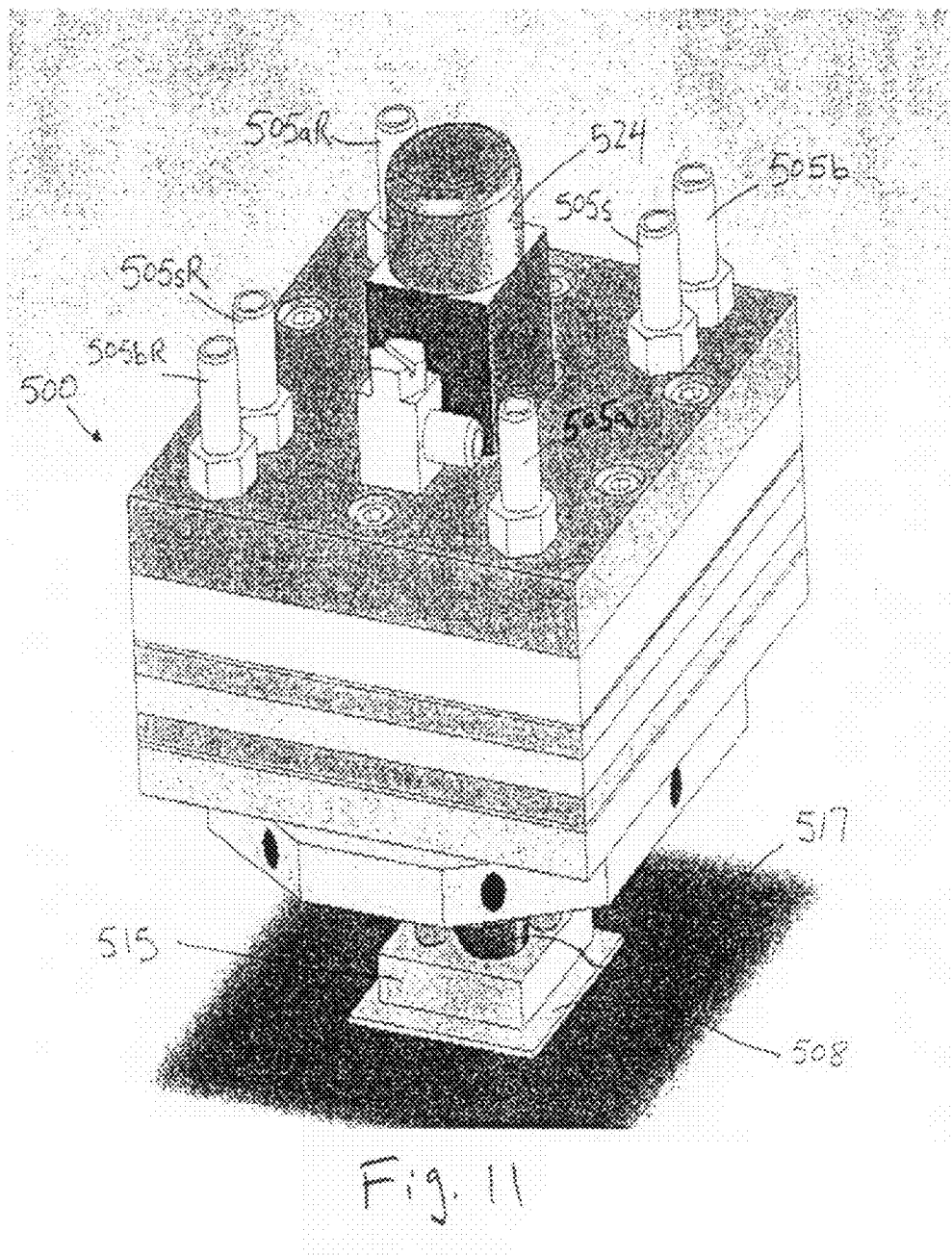
FIG. 11 shows an exemplary perspective schematic view of a thermal chuck according to the further embodiment of the present invention.

FIG. 8 shows that impinged fluid from return conduit 505R is returned to the setpoint fluid source 513 via setpoint fluid return conduit 505sR and is also returned to the cold fluid source 510 via cold fluid return conduit 505aR. In other words, while three fluid supply conduits 505a, 505s, 505h are supplied to the thermal chuck, only two fluid return conduits 505aR, 505sR (or 505aR, 505bR; or 505sR, 505bR) may be supplied from the thermal chuck. However, FIG. 11 shows a schematic perspective view of the thermal chuck 500 having three fluid supply conduits 505a, 505s, 505b supplied to the thermal chuck, and three fluid return conduits 505aR, 505sR, 505bR supplied from the thermal chuck. Those of skill in the art would appreciate that in alternative embodiments, only one fluid return conduit may be supplied from the thermal chuck. Further, after the combined fluid impinges upon the heat sink 515, there is little temperature difference between the setpoint and hot fluids, so the setpoint fluid return conduit 505sR is located next to the hot fluid return conduit 505bR on the upper portion of the thermal chuck 500, thereby resulting in little thermal loss. Additionally, the aforementioned combined fluid return could be performed either internally or externally to the chuck 500.

Although the cold 510 and setpoint 513 fluid sources may preferably circulate fluid at approximately a constant thirty liters per minute, it is understood by those skilled in the art that other suitable different fluid circulation rates may be employed, and the circulated rate can be varied instead of constant. Further, as with the previously-described embodiments, cold, setpoint and hot conduits are adjustable, for example, so that a proportion of the mixed fluid portion entering each of the cold, setpoint and hot conduits corresponds to the proportion of the cold, setpoint or hot fluid portions exiting entering the conduits.

It is noted that a plurality of thermal chucks 400, 500 (having a plurality of heat sinks 415, 515) may be used in the present invention in a manner shown in FIG. 3, and fluid passing therethrough may be connected serially or in parallel. In this regard, FIG. 8 schematically shows a block of additional thermal chucks 500n to be interconnected with the thermal chuck 500.

Figure 12:
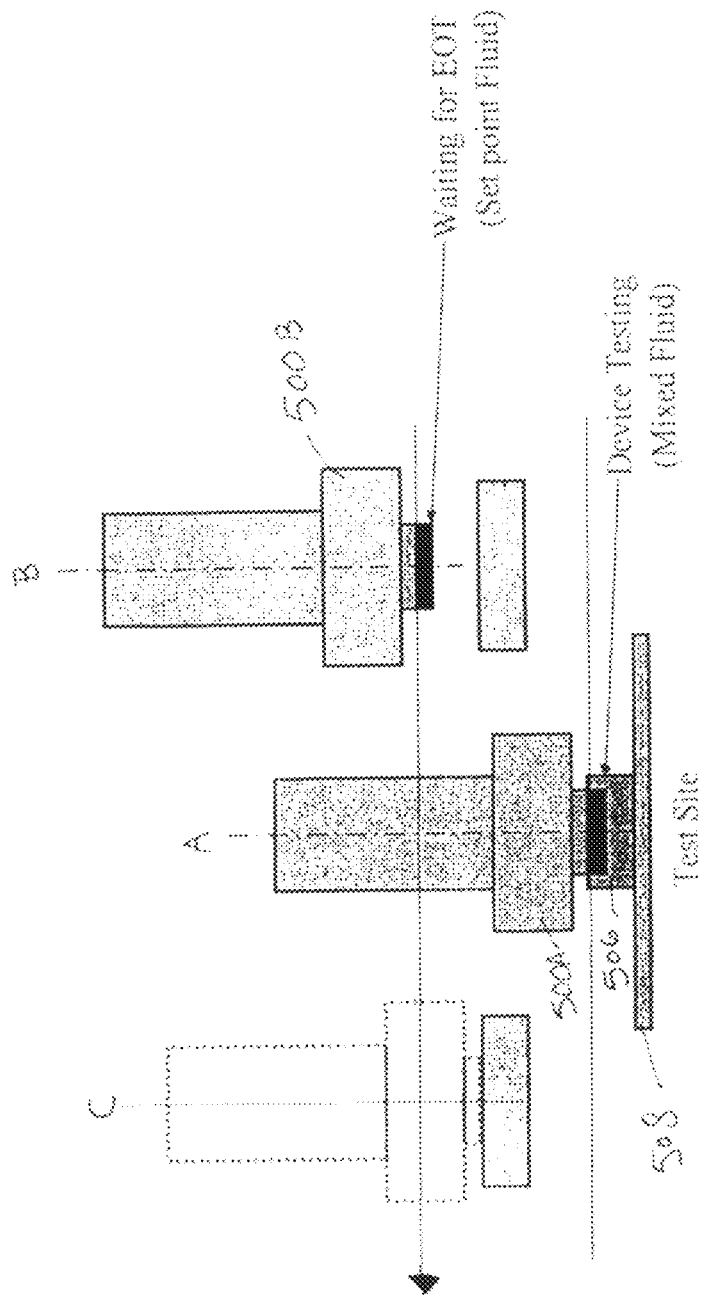
FIG. 12 shows an exemplary schematic side elevational view of a dual chuck system according to the further embodiment of the present invention.

In many uses, it is common to use more than one thermal chuck 400, 500 in a system to interchangeably test sequential DUTs 506 at a test site on a substrate 508 at a test site to allow quick replacement of the DUT. FIG. 12 shows such a system of two thermal chucks 500A, 500B with one thermal chuck 500A actively testing a DUT 506 at the test site (position A), while another thermal chuck 500B waits for thermal chuck 500A to finish testing the DUT (i.e., the thermal chuck waits for the end of test, or EOT, at position B), whereupon the thermal chuck 500A will move to holding position C and thermal chuck 500B will move to position A to test the next DUT. Once thermal chuck 500B finishes testing the next DUT, thermal chuck 500A will move from holding position C back to position A to test another DUT. Thus process continues until all DUTs are tested.

Rapidly successively testing DUTs (e.g. in situations where multiple thermal chucks 500 are to be used), generally requires expenditure of a significant amount of energy lost as a result of repeated heating and cooling of the heat sink. As is known in the art, the greater the difference in temperature between the mixed fluids, the greater the energy loss. In the above-described configuration, the thermal chuck 500B at position B exclusively discharges setpoint fluid such that setpoint fluid exclusively impinges upon the heat sink 515 (i.e., the valve 524 is exclusively set at the 90 rotational degree position) thereby maintaining the heat sink of the thermal chuck 500B at position B at a generally constant temperature and eliminating the requirement of mixing fluids of different temperatures, thereby significantly reducing the energy expenditure at the system level. Further, since the heat sink of the thermal chuck 500B at position B is maintained at a generally constant setpoint temperature and fluid mixing is eliminated, at the start of test, induced thermal gradients across the heat sink 515 and on the DUT is greatly reduced. Additionally, for increased energy efficiency, use of a chiller may be eliminated for low setpoint testing of DUTs.

As stated above, because there is no heater directly heating the heat sink to perform the above methods of thermal control, the disclosed embodiments improve thermal resistance characteristics and remove induced gradients, enabling use of extreme delta T's not supported by conventional systems. Also, the disclosed embodiments create more energy dissipation and fluster response times. One result is that the disclosed embodiments enable more rigorous testing of electronic devices, handling tests beyond the effective 500 Watt limit of convention devices, e.g. up to 1500 Watts. Further, thermal control of electronic devices in any environment (testing and/or operational) is greatly enhanced.

Although the invention has been described with reference to several exemplary embodiments, which can be combined in any suitable manner, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods and uses such as are within the scope of the appended claims.

What is claimed:

1. An apparatus for controlling a temperature of a device under test, comprising:
   an adjustable first fluid source configured to input a cold fluid having a first temperature;
   an adjustable second fluid source configured to input a set point fluid having a second temperature that is substantially the same temperature of a set point temperature of the device and higher than the first temperature;
   an adjustable third fluid source configured to input a hot fluid having a third temperature higher than the first and second temperatures;
   a cold line that conveys the cold fluid from the adjustable first fluid source;
   a set point line that conveys the set point fluid from the adjustable second fluid source;
   a hot line that conveys the hot fluid from the adjustable third fluid source;
   a valve configured to discharge an adjustable amount of at least two of the cold fluid, the set point fluid, and the hot fluid into a combined fluid, the valve being located at a junction of the cold line, the set point line and the hot line;
   a heat sink configured to be in thermal contact with the device, wherein the combined fluid is discharged from the valve to the heat sink and circulates through the heat sink;
   a first fluid return line; and
   a second fluid return line,
   wherein an opening of the valve is controlled to discharge the adjustable amount of at least two of the cold fluid, set point fluid, and hot fluid such that a heat sink temperature compensates for changes in the device temperature and substantially maintains the set point temperature of the device, and
   after the combined fluid impinges on the heat sink, the valve discharges the combined fluid to the first fluid return line and the second fluid return line such that a portion of the combined fluid returns to the first fluid source via the first fluid return line, and a remaining portion of the combined fluid returns to the second fluid source via the second fluid line.

2. The apparatus according to claim 1, wherein the valve is a disk valve.

3. The apparatus according to claim 1, wherein the second temperature of the set point fluid is closer to the first temperature of the cold fluid than to the third temperature of the hot fluid.

4. The apparatus according to claim 1, wherein at least two of the cold fluid, the set point fluid, and the hot fluid are portions of a same fluid.

5. The apparatus according to claim 1, wherein the cold fluid, the set point fluid, and the hot fluid are all portions of a same fluid.

6. The apparatus according to claim 1, comprising:
   a first electrical component testing device and a second electrical component testing device respectively having a first valve and a second valve and further respectively having a first heat sink and a second heat sink,
   wherein at least the second valve is configured to exclusively discharge the set point fluid that impinges on the second heat sink, and
   when the first electrical component testing device tests an electrical component, the first valve discharges the combined fluid that impinges on the first heat sink, the second electrical component testing device waits to test a next electrical component and the second valve exclusively discharges the second fluid that impinges on the second heat sink.

7. The apparatus according to claim 1, wherein:
   the heat sink comprises a plurality of fins; and
   a direction in which the combined fluid impinges on the heat sink is generally perpendicular to a direction in which the fins extend.

8. The apparatus according to claim 1, wherein the valve is located at the junction of the cold line, the set point line, the hot line, the first fluid return line and the second fluid return line.

9. The apparatus according to claim 1, further comprising a manifold at which each of the cold fluid passing through the cold line, the set point fluid passing through the set point line and the hot fluid passing through the hot line communicates with the valve.

10. The apparatus according to claim 1, wherein the valve is controlled to exclusively mix the set point fluid with the cold fluid during testing of the device.

* * * * *